United States Patent [19]
Yonehara

[11] Patent Number: 5,433,168
[45] Date of Patent: Jul. 18, 1995

[54] METHOD OF PRODUCING SEMICONDUCTOR SUBSTRATE
[75] Inventor: Takeo Yonehara, Atsugi, Japan
[73] Assignee: Canon Kabushiki Kaisha, Tokyo, Japan
[21] Appl. No.: 61,509
[22] Filed: May 14, 1993

Related U.S. Application Data

[63] Continuation of Ser. No. 675,279, Mar. 26, 1991, abandoned.

[30] Foreign Application Priority Data

Mar. 27, 1990 [JP] Japan ................................ 2-80005
Mar. 1, 1991 [JP] Japan ................................ 3-036176

[51] Int. Cl.$^6$ ............................................. C30B 25/02
[52] U.S. Cl. ...................................... 117/90; 117/84; 437/69
[58] Field of Search .............. 156/610, 612, DIG. 64, 156/DIG. 111; 437/69, 71, 78, 83, 228, 946, 985; 117/84, 88, 89, 90

[56] References Cited

U.S. PATENT DOCUMENTS 4,380,865  4/1983  Frye et al. ............................. 29/576
5,098,850  3/1992  Nishida et al. ......................... 437/4

FOREIGN PATENT DOCUMENTS 312466  4/1989  European Pat. Off. .

OTHER PUBLICATIONS

"Defect-Free Silicon on Insulator by Oxidized Porous Silicon," IBM Technical Disclosure Bulletin, L. A. Nesbit, vol. 27, No. 8, Jan. 1985, pp. 4632–4633.
"Porous silicon layers and its oxide for the silicon-on-insulator Structure" J. Appl. Phys., H. Takai et al., vol. 60, No. 1, Jul. 1, 1986, pp. 222–225.
"Le silicium sur isolant: 'etat de l'art et perspectives d'avenir," L'Onde Electrique, D. Bensahel et al., vol. 69, No. 1, Jan. 1989, pp. 57–66.
"Characterization of O.1 μm Thick Isolated Silicon Layers on Porous Oxidized Silicon," Japanese Journal of Applied Physics Supplements, 1983, pp. 105–108.
Patent Abstracts of Japan, vol. 10, No. 104, Apr. 19, 1986 & JP-A-60 244039, Dec. 3, 1985.
"New silicon-on-insulator technology using a two-step oxidation technique," Appl. Phys. Lett., Lin et al., vol. 49, No. 17, Oct. 27, 1986, pp. 1104–1106.
Imai, et al., "Crystalline Quality of Silicon Layer Formed By Fipos Technology." Journal of Crystal Growth 63 (1983) 547–533.
Uhlir, "Electrolytic Shaping of Germanium and Silicon." The Bell System Technical Journal, vol. XXXV, 1956.
Unigami, "Formation of Mechanism of Porous Silicon Layer by Anodization in HF Solution." Jour. of the Electrochemical Soc. vol. 127, No. 2, Feb. 1980.
Imai, "A New Dielectric Isolation Method Using Porous Silicon." Solid–State Electronics, vol. 24, No. 2, Feb. 1981.
Holstrom and Chi, "Complete Dielectric Isolation by Highly Selective and Self-Stopping Formation of Oxidized Porous Silicon." Appl. Phys. Feb. 13, 1983.
Takai and Itoh, "Porous Silicon Layers and its Oxide for the Silicon–on–Insulator Structure." Appl. Phys. Jul. 1, 1986.
Tsubouchi et al., "Oxidation of Silicon in High-Pressure Steam." Japanese Journal of Applied Physics, vol. 16, No. 5, May 1977.
"Crystallization of Silicon Films on Class: A Comparison of Methods"; Lemons, et al; *Material Research Society Symposia Proceedings* (vol. 13); Laser–Solid Interactions and Transient Thermal Proceedings of Materials; (1983); pp. 581–592.

Primary Examiner—R. Bruce Breneman
Assistant Examiner—Fehisa Garrett
Attorney, Agent, or Firm—Fitzpatrick, Cella, Harper & Scinto

[57] ABSTRACT

The present invention relates to a method of producing a semiconductor substrate which is suitable for an electronic device or an integrated circuit in the form of dielectric separation or having a single crystal semiconductor layer formed on an insulator.

The method comprises the steps of making a silicon substrate porous, forming a silicon single crystal on the porous substrate and oxidizing the porous silicon substrate to form a semiconductor layer having good crystallinity on an insulating support, particularly a support having light transmission.

75 Claims, 3 Drawing Sheets

METHOD OF PRODUCING SEMICONDUCTOR SUBSTRATE

This application is a continuation of application Ser. No. 07/675,279 filed Mar. 26, 1991, now abandoned.

BACKGROUND OF THE INVENTION

1. Field of the Invention

The present invention relates to a method of producing a semiconductor substrate, and particularly to a method of producing a semiconductor substrate which is dielectrically separated or formed in a single-crystal semiconductor layer on an insulator so as to be suitable for electronic devices and integrated circuits.

2. Description of Prior Art

Formation of a single-crystal semiconductor layer on an insulator is widely known as "silicon on insulator (SOI) technique" and is investigated in various fields because devices formed by employing the SOI process have many advantages which cannot be attained by general bulk Si substrates used for forming Si integrated circuits. Namely, the use of the SOI technique permits the attainment of the following advantages:

1. It is easy to perform dielectric separation and possible to perform high integration.
2. The radiation resistance is excellent.
3. It is possible to reduce the floating capacity and increase the operating speed.
4. It is possible to omit the well process.
5. It is possible to prevent latching-up.
6. It is possible to form a fully depletion-type field effect transistor by reducing the thickness.

Methods of forming SOI structures have been investigated for several years with a view to realizing the above-described characteristic advantages of these devices. The contents of the investigation are summarized in, for example, the following document: Special Issue: "Single-crystal silicon on non-single-crystal insulators"; edited by G. W. Cullen, Journal of Crystal Growth, volume 63, no 3, pp 429–590 (1983).

The SOS (silicon on sapphire) technique for heteroepitaxy of a Si layer on a single-crystal sapphire substrate by CVD (chemical vapor deposition) has also been known for a long time. Although the SOS technique is successfully achieved as the most mature SOI technique for the present, the SOS technique has the problem that large quantities of crystal defects occur due to the lattice non-conformity at the interface between the Si layer formed and the ground sapphire substrate and that aluminum is mixed in the Si layer from the sapphire substrate. First of all, the high price of the substrate and the retardation in increase in the area inhibit the widening of the application of the SOS technique.

In relatively recent years, attempts have been made to realize a SOI structure without using a sapphire substrate. Such attempts are roughly divided into the following two types:

1. After the surface of a Si single crystal substrate has been oxidized, a window is formed in the oxide surface to partially expose the Si substrate, and a Si single crystal layer is formed on $SiO_2$ by lateral epitaxial growth using as a seed the window (in this case, the Si layer is deposited on $SiO_2$).
2. A Si single crystal substrate is used as an active layer so that $SiO_2$ is formed below the substrate (in this case, no Si layer is deposited on $SiO_2$).

Known means for realizing the above method 1 include a method of epitaxially growing a Si single-crystal layer in the lateral direction directly by the CVD process, a method of depositing amorphous Si and then epitaxially growing a solid phase in the lateral direction, a method of applying a convergent energy beam such as an electron beam, a laser or the like to an amorphous or polycrystal Si layer to grow a single crystal layer on $SiO_2$ by melting recrystallization, and a method of scanning a zone melt region by using a rod-shaped heater (zone melting recrystallization). Although these methods have advantages and disadvantages, they have not yet been yet put into practical use in the industrial field because they may have problems with respect to controllability, productivity, uniformity and quality. For example, the CVD process requires sacrificial oxidation for forming a flat thin film. The solid growth method produces a crystal having defective crystallinity. The beam annealing method using an energy beam has the problems with respect to the processing time required for scanning by using a convergent beam and controllability of the degree of overlap of beams, focusing and so on. Although the zone melting recrystallization method among the above methods is most mature, and a relatively large scale integrated circuit can be experimentally formed by this method, many crystal defects such as sub-grains and the like still remain, and no minority carrier device can be formed by this method. Any one of these methods requires a Si substrate and thus cannot form a Si single crystal layer of high quality on a transparent amorphous insulating substrate such as a glass substrate.

The above method 2 in which a Si substrate is not used as a seed for epitaxial growth includes the following four methods:

1. An oxide film is formed on a Si single crystal substrate having a surface with V-shaped grooves formed therein by anisotropic etching, a polycrystal Si layer is deposited on the oxide film so that the thickness is substantially the same as that of the Si substrate, and a Si single crystal region surrounded by the V-shaped grooves so as to be dielectrically separated is then formed by grinding from the rear side of the Si substrate. Although this method produces a layer having good crystallinity, it still has problems with respect to the process of depositing polycrystal Si having a thickness as large as several hundreds microns and the process of leaving only a separate Si active layer on the substrate by grinding the rear side of the Si single crystal substrate, and problems involving controllability and productivity.

2. A method called SIMOX (separation by ion implanted oxygen) in which a $SiO_2$ layer is formed by implanting oxygen ions in a Si single crystal substrate. This method at present is the most mature process because of its good conformity with the Si process. However, it is necessary for forming the $SiO_2$ layer to implant oxygen ions in an amount of $10^{18}$ ions/cm$^2$ or more. The implantation of ions takes much time, and thus it cannot be said that the method has high productivity. In addition, the wafer is high in cost, and many crystal defects still remain. The $SiO_2$ layer has quality insufficient to the formation of a minority carrier device.

3. A method of bonding a Si single crystal substrate to a separate Si single crystal substrate or quartz substrate which is subjected to thermal oxidation by heat treatment or using an adhesive to form a SOI structure. In this method, it is necessary for forming a device to form a uniform thin active layer. Namely, it is necessary to grind the Si single crystal substrate having a thickness of several hundreds microns to a thickness on the order of one micron or less. The method therefore has many problems with respect to its productivity, controllability and uniformity. In addition, the need for two substrates causes an increase in the cost.

4. A method of forming a SOI structure by dielectric separation caused by oxidation of porous Si. In this method, an n-type Si layer is formed in an island-like shape on a surface of a p-type Si single crystal substrate by implanting proton ions (Imai et al., J. Crystal Growth, vol 63, 547 (1983)) or epitaxial growth and patterning, only the p-type Si substrate is made porous by anodic etching in a HF solution in such a manner that the Si island on the surface is surrounded by the solution, and the n-type Si island is then dielectrically separated by enhanced oxidation. This method has the problem that the degree of freedom for design of a device is in some cases limited because the Si region separated is determined before the device process.

The thin film Si layer deposited on a glass substrate representative of light-transmitting substrates is generally an amorphous layer or, at best, a polycrystal layer because the Si layer reflects the disorder of the crystal structure of the substrate, and no high-quality device can thus be formed by using the Si layer. This is because the substrate has an amorphous crystal structure, and the fact is that a single crystal layer of high quality cannot be easily obtained by simply depositing a Si layer.

The formation of a semiconductor device on a light-transmitting substrate is important for forming a contact sensor and a projection-type liquid crystal image display, which serve as light-receiving devices. In addition, a high-quality driving element is required for further increasing the density, resolution and fineness of pixels (picture elements) of such a sensor or display. It is consequently necessary to produce an element to be provided on a light-transmitting substrate by using a single crystal layer having excellent crystallinity.

It is therefore difficult to produce a driving element having properties sufficient for the present demands or future demands because the crystal structure of an amorphous Si or polycrystal Si has many defects.

However, any one of the methods using a Si single crystal substrate is unsuitable for obtaining a good single crystal film on a light-transmitting substrate.

In addition, since the rate of thermal oxidation of a Si single crystal is about 1 micron per hour (wet oxidation at 1200° C. and atmospheric pressure), several hundreds of hours are required for oxidizing a whole Si wafer having a thickness of several hundred microns and leaving the surface layer unoxidized. Further, it is known that when Si is oxidized to $SiO_2$, there is an accompanying increase in volume by 2.2 times. This sometimes causes the problem that, if a Si substrate is oxidized without any other processing, cracks or warpages may occur in the Si layer owing to the application of stress exceeding the elastic limit to the Si layer remaining on the surface.

SUMMARY OF THE INVENTION

It is an object of the present invention to provide a method of producing a semiconductor substrate which can solve the above problems and satisfy the above requirements.

It is another object of the present invention to provide a method of producing a semiconductor substrate which exhibits excellent productivity, uniformity and controllability and low cost for obtaining a Si crystal layer having crystallinity which is not inferior to that of a single crystal wafer on a transparent substrate (light-transmitting substrate).

It is still another object of the present invention to provide a method of producing a semiconductor substrate which is capable of realizing and utilizing the advantages of a conventional SOI device.

It is a further object of the present invention to provide a method of producing a semiconductor substrate which can be used in place of SOS or SIMOX in the production of a large scale integrated circuit having a SOI structure.

It is a still further object of the present invention to provide a method of producing a semiconductor substrate comprising the steps of making a silicon substrate porous, forming a silicon single crystal on the porous substrate and oxidizing the porous silicon substrate.

It is another object of the present invention to provide a method of producing a semiconductor substrate comprising the steps of providing a silicon substrate having a first side which is of the n-type and a second side, making the second side of the silicon substrate porous, and oxidizing the porous side of the silicon substrate.

It is a further object of the present invention to provide a method of producing a semiconductor substrate comprising the steps of making a silicon single crystal substrate wholly porous, forming a first antioxidant layer on at least one side of the porous silicon, oxidizing the porous silicon except that a portion of the porous silicon on the side facing the first antioxidant layer is left unoxidized, removing the first antioxidant layer, forming a single crystal layer on the unoxidized portion of the porous silicon, forming a second antioxidant layer on the silicon single crystal layer, oxidizing the unoxidized portion of the porous silicon, and removing the second antioxidant layer.

It is a still further object of the present invention to obtain a Si single crystal layer having extremely few defects on a light-transmitting $SiO_2$ substrate by changing a Si single crystal substrate to $SiO_2$ from one side thereof so as to leave a Si active layer on the surface of the $SiO_2$ substrate. The Si active layer formed is excellent in economy and is uniform and flat over a large area and which has excellent crystallinity.

DESCRIPTION OF PREFERRED EMBODIMENTS

Preferred embodiments of a method of producing a semiconductor substrate of the present invention are described in detail below with reference to the drawings.

Figure 1A:
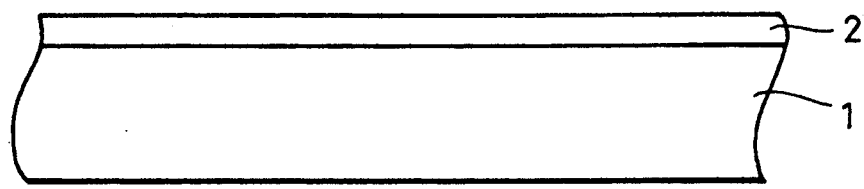
FIG. 1 is a schematic sectional view for explaining the steps of a method of producing a semiconductor substrate in accordance with an embodiment of the present invention.
Figure 1B:
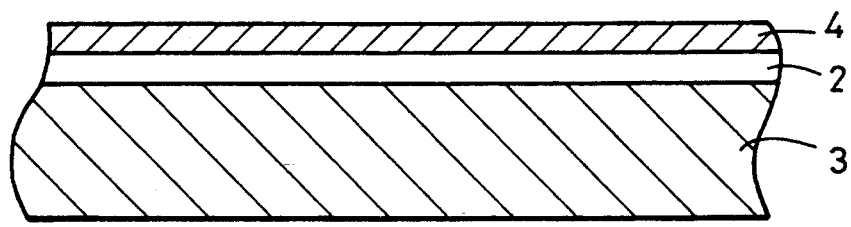
Figure 1C:
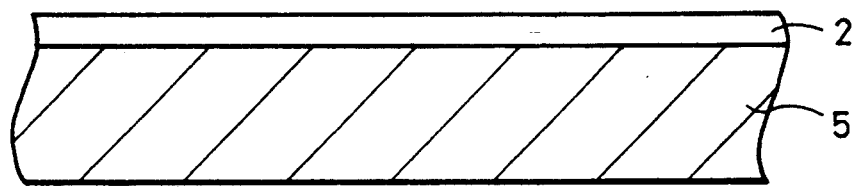

FIGS. 1(a) to 1(c) are respectively schematic sectional views explaining the steps of a method of producing a semiconductor substrate of the invention.

As shown in FIG. 1(a), proton ions are implanted in the surface of a p-type Si single crystal substrate 1 to form an n-type single crystal layer 2. Alternatively, an n-type Si layer 1 is formed on the p-type single crystal substrate 1 by vapor epitaxial growth.

As shown in FIG. 1(b), the p-type Si single substrate 1 is changed to a Si porous substrate (porous Si layer) 3 by an anodic etching using a HF solution. The density of the porous Si layer can be changed within the range from 1.1 to 0.6 g/cm$^3$ by changing the concentration of the HF solution from 50 to 20%, as compared with the density of 2.33 g/cm$^3$ for a Si single crystal. The porous layer is not formed in the n-type Si layer, while it is formed only in the p-type Si single crystal substrate. The reasons for this will be described below.

As shown in FIG. 1(b), a $Si_3N_4$ layer 4 is then formed as an antioxidant film on the surface of the n-type Si layer 2 which is not made porous.

The whole p-type Si porous substrate 3 is then oxidized to $SiO_2$, and the $Si_3N_4$ provided as an antioxidant film is removed to form a semiconductor substrate of the present invention, as shown in FIG. 1(c).

A light-transmitting insulating substrate 5 is produced by oxidizing the whole p-type Si porous substrate 3 to $SiO_2$. During the oxidation, a thin $SiO_2$ layer may be inserted as a buffer layer between the n-type Si layer and the antioxidant film $Si_3N_4$ layer 4 for the purpose of preventing the occurrence of defects in the single crystal due to the distortion caused by the oxidation of the p-type Si porous substrate 3.

The present invention thus enables the formation of a semiconductor substrate comprising the $SiO_2$ light-transmitting insulating substrate 5 and the Si single-crystal layer 2 which has the same degree of crystallinity as that of a silicon wafer and which is flatly and uniformly formed in a thin layer over a large area.

The thus-formed semiconductor substrate can be preferably used for producing an electronic device dielectrically separated on a light-transmitting substrate.

The Si porous layer formed by the above-described process has holes having an average size of about 600 Å which was measured by observation by a transmission electron microscope. Although the Si porous layer has a density which is half or less than that of a Si single crystal, as described above, single crystallinity is maintained, and a Si single crystal layer can be formed on the porous layer by epitaxial growth. However, since the characteristic of enhanced oxidation described below is lost due to the rearrangement of the inner holes at 1000° C. or more, it is necessary to ensure that the temperature of formation of a single crystal is not higher than the required temperature.

Porous Si was discovered in the course of research on electropolishing of a semiconductor which was conducted by Uhlir et al. in 1956 (A. Uhlir, Bell Syst. Tech. J., vol 35, p 333 (1956)).

Unagami et al. investigated the Si dissolution reaction during anodic etching and reported that the anodic reaction of Si in a HF solution requires holes, and that the reaction is expressed as follows (T. Unagami: J. Electrochem. Soc., vol. 127, p. 476 (1980)):

$$Si + 2HF (2-n)e^+ \longrightarrow SiF_2 + 2H^+ + ne^-$$

-continued $$SiF_2 + 2HF \longrightarrow SiF_4 + H_2$$

$$SiF_4 + 2HF \longrightarrow H_2SiF_6$$

or $$Si + 4HF + (4-\lambda)e^+ \longrightarrow SiF_4 + 4H^+ + \lambda e^- \; SiF_4 + 2HF$$

$$\longrightarrow H_2SiF_6$$

wherein $e^+$ and $e^-$ respectively denote a hole and an electron, and n and $\lambda$ each denotes the number of holes required for dissolving one silicon atom. Porous silicon can be formed when the condition, $n>2$ or $\lambda>4$, is satisfied.

It is therefore found that, in this case, the p-type silicon having holes can be made porous, while the n-type silicon cannot be made porous because the number of holes in the n-type silicon is smaller than that of holes in the p-type silicon.

The selectivity of oxidation in the process of making silicon porous has been proved by Imai (Nagano, Nakajima, Yasuno, Ohnaka, Kajiwara, Technical Research Report of the Institute of Electronics and Communication Engineers of Japan, vol 79, SDS 79-9549 (1979) and K. Imai, Solid-State Electronics vol 24, 159 (1981)).

In addition, because the porous layer has large quantities of voids formed therein, the density thereof is reduced to half or less. Since the surface area is consequently significantly increased, as compared with the volume, the oxidation rate is increased by hundred times or more, as compared with the oxidation rate of a usual single crystal layer (H. Takai, T. Itoh, J. Appl. Phys., Vol 60, No 1, p. 222 (1986)).

Namely, as described above, since the oxidation rate at 1200° C. of the Si single crystal substrate is about 1 micron per hour, the oxidation rate of the porous Si reaches about 100 microns per hour, and oxidation of the whole of a wafer having a thickness of several hundred microns can be put into practical use. In addition, the oxidation time can be further reduced by employing the oxidation rate increasing phenomenon during oxidation under pressure higher than the atmospheric pressure (N. Tsubouchi, H. Miyoshi, A. Nishimoto and H. Abe, Japan J. Appl. Phys., Vol 16, No 5, 855 (1977)).

Although the volume of a Si single crystal is increased by 2.2 times by oxidation, the increase in volume can be controlled or suppressed by controlling the density of the porous Si so that the occurrence of curvature of a semiconductor substrate or the occurrence of a crack in a single crystal layer provided on the surface of the substrate can be avoided during the oxidation process.

The volume ratio R of Si single crystal to porous Si after oxidation can be expressed as follows:

$$R = 2.2 \times (A/2.3)$$

wherein A denotes the density of porous Si.

When it is desired that $R=1$, i.e., that there is no increase in volume after oxidation, A in the above formula may be 1.06 (g/cm$^2$). Namely, if the density of the porous layer is 1.06, an increase in volume, which is caused by oxidation, can be suppressed.

The above method is an example of methods in which the n-type layer is formed before the substrate is made porous, and only the p-type substrate is then selectively made porous by etching oxidation.

As described above, the porous Si layer has holes having an average size of about 600 Å, which was measured by observation by a transmission electron microscope. Although the density of the porous Si layer is reduced to a half or less than that of Si single crystal, the single crystallinity is maintained, and a Si single crystal layer can be formed on the porous layer by epitaxial growth. However, since the characteristic of enhanced oxidation is lost due to the rearrangement of the inner holes at 1000° C., low-temperature growth such as molecular beam epitaxial growth, plasma CVD, optical CVD, bias sputtering growth or the like is preferable for epitaxial growth of a Si layer.

For example, a method in which the whole region of a p-type Si single crystal substrate is made porous, and a single crystal layer is then formed on the porous Si substrate by epitaxial growth is also effective as the method of producing a semiconductor substrate of the present invention.

A brief description is made of another preferred embodiment of the method of producing a semiconductor substrate of the present invention in which a whole p-type Si single crystal substrate is made porous, and a single crystal layer is then formed thereon by epitaxial growth.

A p-type Si single crystal substrate is first prepared and then entirely made porous. The method of making the substrate porous may be the same as that described above.

A thin film single crystal layer is then formed on the surface of the porous substrate by epitaxial growth at a low temperature.

After silicon nitride is deposited on the surface of the epitaxial layer to form an antioxidant film thereon, the porous substrate is oxidized so that the porous substrate is wholly changed to silicon oxide.

The surface antioxidant film is then removed by the same method as that described above to produce a semiconductor substrate of the present invention comprising a light-transmitting insulating substrate and a single crystal layer formed thereon.

In this case, the buffer layer may also be provided.

A method of producing a semiconductor substrate in accordance with still another embodiment of the present invention is described below with reference to FIGS. 2(a) to 2(e). This embodiment is different from the above embodiment in that the whole semiconductor substrate is not oxidized at one time, and instead a portion of the substrate is left unoxidized. This is effective for reducing the stress applied to the epitaxial layer when the volume is increased in the oxidation process.

Stress is sometimes applied to the epitaxial layer when the volume of the porous region is increased by oxidation. Although the degree of porosity can be controlled so that there is no effect on such stress, the problem with respect to such stress can be removed by this embodiment even if the degree of porosity is slightly shifted.

FIGS. 2(a) to 2(e) are schematic sectional views explaining the steps of a method of producing a semiconductor substrate of the present invention.

Figure 2A:
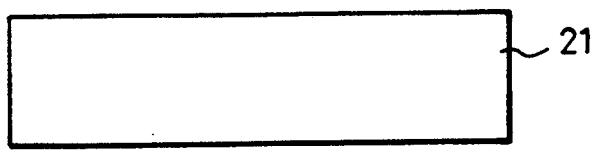
FIG. 2 is a schematic sectional view for explaining the steps of a method of producing a semiconductor substrate in accordance with another embodiment of the present invention.

As shown in FIG. 2(a), a p-type Si single crystal substrate 21 is first prepared.

Figure 2B:

As shown in FIG. 2(b), the Si single crystal substrate 21 is then entirely changed to a porous Si substrate 22 by anodic etching using a HF solution.

Figure 2C:
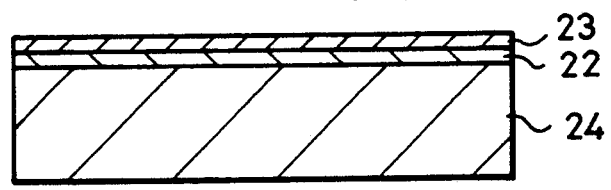

As shown in FIG. 2(c), after a layer of $Si_3N_4$ 23 has been deposited on a surface of the thus-obtained porous Si substrate 22 to form an antioxidant film, the porous Si substrate 22 is oxidized to obtain an insulating substrate 24. At this time, the whole region of the porous Si substrate is oxidized except that an extremely small portion of the porous Si substrate 22 on the side facing the $Si_3N_4$ 23 is left unoxidized.

Figure 2D:
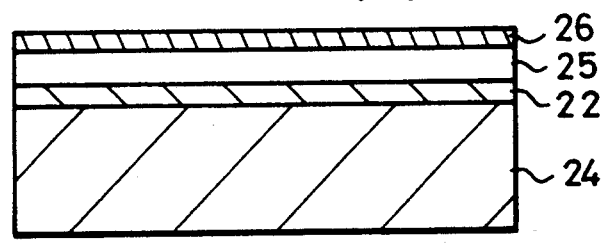

After the $Si_3N_4$ 23 has been removed, as shown in FIG. 2(d), a single crystal layer 25 is formed by epitaxial growth on the unoxidized surface of the porous Si substrate 22, and an antioxidant film 26 is then formed on the single crystal layer 25.

Figure 2E:
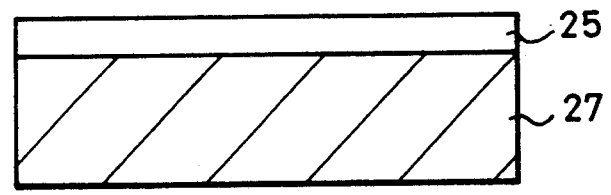

The porous Si 22 immediately below the single crystal layer 25 is then oxidized to form a light-transmitting substrate 27, and the antioxidant film 26 is then removed. As a result, as shown in FIG. 2(e), a semiconductor substrate comprising the light-transmitting substrate and the single crystal layer formed thereon is produced.

The use of this process also enables the formation of a semiconductor substrate comprising a $SiO_2$ light-transmitting insulating substrate and a Si single crystal layer having crystallinity which is the same as or equivalent to that of a silicon wafer and which is flatly and uniformly formed in a thin layer over a large area.

The thus-formed semiconductor substrate can be preferably used for producing an electronic device dielectrically separated on a light-transmitting substrate.

The method described above with reference to FIG. 2 decreases the time that the formed single crystal layer is exposed to the oxidizing atmosphere. Therefore, no substantial problem occurs even if the antioxidant film has a defective portion, causing the single crystal semiconductor region to be exposed to the oxidizing atmosphere. Similarly, no substantial problem occurs when an antioxidant film having a lower protective force than that of silicon nitride is used. The method can produce a semiconductor substrate having a semiconductor layer with excellent characteristics.

In this case, a buffer layer may also be provided.

The region to be made porous is not limited to the p-type region, the n-type region may also be made porous so long as a current necessary and sufficient for anodic etching can be passed therethrough. However, if a region to be made porous is controlled to the n-type or p-type region, it is necessary to control the content of impurities in each of the regions.

Lower resistant Si and p-type Si generally have the tendency to be easily made porous.

When p-type or n-type Si is formed, an atom in Group III or V in the Periodic Table may be contained as an impurity. When the p-type Si is made porous, the concentration of impurities is preferably $10^{15}$ cm$^{-3}$ or more, more preferably $10^{16}$ cm$^{-3}$, and most preferably $10^{16}$ to $3 \times 10^{17}$ cm$^{-3}$. In the case of the n-type Si, the concentration is preferably $10^{13}$ cm$^{-3}$ or more, and more preferably, $10^{16}$ to $10^{13}$ cm$^{-3}$.

The present invention is described below with reference to preferred embodiments.

(Embodiment 1)

An n-type Si epitaxial layer was grown to a thickness of 1 micron on a p-type (100)Si substrate having a thickness of 200 microns by the CVD process. The conditions for deposition were the following:

| Reaction gas flow-rate: | SiH$_2$Cl$_2$ | 1000 SCCM |
| --- | --- | --- |
| | H$_2$ | 230 l/min. |
| | PH$_3$ (50 ppm) | 72 SCCM |
| Temperature: | | 1080° C. |
| Pressure: | | 80 Torr |
| Time: | | 2 min. |

The substrate was then subjected to anodic etching in a 50% HF solution. During the oxidation, the current density was 100 mA/cm$^2$. During this process, the rate with which the substrate was made porous was 8.4 μm/min., and the whole p-type Si substrate having a thickness of 200 microns was made porous within 24 minutes. As described above, during the anodic etching, only the p-type (100) Si substrate was made porous, and the n-type Si epitaxial layer was not changed. Si$_3$N$_4$ was then deposited on the surface of the epitaxial layer to have a thickness of 0.1 μm by the reduced pressure CVD process to form an antioxidant film, and only the p-type (100) Si substrate was then oxidized. As described above, although the rate of thermal oxidation of a normal Si single crystal is about 1 micron per hour (wet oxidation at 1200° C. and atmospheric pressure), the rate of oxidation of the porous layer is higher by at least a hundred times. Namely, the p-type (100) Si substrate having a thickness of 200 microns was oxidized within 2 hours. The Si$_3$N$_4$ layer was then removed to form a Si single crystal layer having a thickness of 1 μm on the upper side of the transparent SiO$_2$ substrate.

As a result of observing the sectional surface by a transmission electronic microscope, it was confirmed that no crystal defect was newly introduced into the Si layer, and good crystallinity was maintained.

(Embodiment 2)

An n-type Si epitaxial layer was grown to a thickness of 0.5 micron on a p-type (100) Si substrate having a thickness of 200 microns by the CVD process. The conditions for deposition were the following:

| Reaction gas flow-rate: | SiH$_2$Cl$_2$ | 1000 SCCM |
| --- | --- | --- |
| | H$_2$ | 230 l/min. |
| | PH$_3$ (50 ppm) | 72 SCCM |
| Temperature: | | 1080° C. |
| Pressure: | | 80 Torr |
| Time: | | 2 min. |

The substrate was then subjected to anodic etching in a 50% HF solution. During the oxidation, the current density was 100 mA/cm$^2$. During this process, the rate with which the substrate was made porous was 8.4 μm/min., and the whole p-type Si substrate having a thickness of 200 microns was made porous within 24 minutes. As described above, during the anodic etching, only the p-type (100) Si substrate was made porous, while the n-type Si epitaxial layer was not changed. Si$_3$N$_4$ was then deposited on the surface of the epitaxial layer to a thickness of 0.1 μm by the reduced pressure CVD process to form an antioxidant film, and only the p-type (100) Si substrate was then oxidized. As described above, although the rate of thermal oxidation of a normal Si single crystal is about 1 micron per hour (wet oxidation at 1200° C. and atmospheric pressure), the rate of oxidation of the porous layer is higher by at least a hundred times. Oxidation was then effected under high pressure for reducing the oxidation time. When wet oxidation was effected at 1200° C. under a pressure of 6.57 kg/cm$^2$, the rate of oxidation was increased by 5 times, and the oxidation of the p-type (100) Si substrate having a thickness of 200 microns was completed within 24 minutes. The Si$_3$N$_4$ layer was then removed to form a Si single crystal layer having a thickness of 1 μm on the upper side of the transparent SiO$_2$ substrate.

As a result of observing the sectional surface by a transmission electronic microscope, it was confirmed that no crystal defect was newly introduced into the Si layer, and good crystallinity was maintained.

(Embodiment 3)

A p-type (100) Si single crystal substrate having a thickness of 200 microns was subjected to anodic etching in a 50% HF solution. During this oxidation, the current density was 100 mA/cm$^2$. During this process, the rate with which the substrate was made porous was 8.4 μm/min., and the whole p-type (100) Si substrate having a thickness of 200 microns was made porous within 24 minutes.

A Si epitaxial layer was grown to a thickness of 0.5 micron on the p-type (100) porous Si substrate at a low temperature by the MBE (Molecular Beam Epitaxy) process. The conditions for deposition were the following:

Temperature: 700° C.
Pressure: 1×10$^{-9}$ Torr
Growth rate: 0.1 nm/sec

After the surface of the epitaxial layer had been oxidized to a thickness of 50 nm, Si$_3$N$_4$ was deposited on the surface of the epitaxial layer to a thickness of 0.1 μm by the reduced pressure CVD process to form an antioxidant film, and only the p-type (100) Si substrate was then oxidized. The porous p-type (100) Si substrate having a thickness of 200 microns was oxidized within 24 minutes. The Si$_3$N$_4$ layer was then removed to form a Si single crystal layer having a thickness of 1 μm on the upper side of the transparent SiO$_2$ substrate.

As a result of observing the sectional surface by a transmission electronic microscope, it was confirmed that no crystal defect was newly introduced into the Si layer, and good crystallinity was maintained.

(Embodiment 4)

A p-type (100) Si single crystal substrate having a thickness of 200 microns was subjected to anodic etching in a 50% HF solution. During this oxidation, the current density was 100 mA/cm$^2$. During this process, the rate with which the substrate was made porous was 8.4 μm/min., and the whole p-type (100) Si substrate having a thickness of 200 microns was made porous within 24 minutes.

A Si epitaxial layer was grown to a thickness of 0.5 micron on the p-type (100) porous Si substrate at a low temperature by the plasma CVD process. The conditions for deposition were the following:

Gas: SiH$_4$
High-frequency power: 100 W
Temperature: 800° C.
Pressure: 1×10$^{-2}$ Torr
Growth rate: 2.5 nm/sec After a surface of the epitaxial layer had been oxidized to a thickness of 50 nm, Si$_3$N$_4$ was deposited on the surface of the epitaxial layer to a thickness of 0.1 μm by the reduced pressure CVD process to form an antioxidant film, and only the p-type (100) Si substrate was then oxidized. The porous P-type (100) Si substrate having a thickness of 200 microns was oxidized within 24 minutes. The Si$_3$N$_4$ layer was then removed to form a Si single crystal layer having a thickness of 1 μm on the upper side of the transparent SiO$_2$ substrate.

As a result of observing the sectional surface by a transmission electronic microscope, it was confirmed that no crystal defect was newly introduced into the Si layer, and good crystallinity was maintained.

(Embodiment 5)

A p-type (100) Si single crystal substrate having a thickness of 200 microns was subjected to anodic etching in a 50% HF solution. During this oxidation, the current density was 100 mA/cm$^2$. During this process, the rate with which the substrate was made porous was 8.4 μm/min., and the whole p-type (100) Si substrate having a thickness of 200 microns was made porous within 24 minutes.

A Si epitaxial layer was grown to a thickness of 0.5 micron on the p-type (100) porous Si substrate at a low temperature by the MBE (Molecular Beam Epitaxy) process. The conditions for deposition were the following:

Temperature: 700° C.
Pressure: 1×10$^{-9}$ Torr
Growth rate: 0.1 nm/sec

After Si$_3$N$_4$ had been deposited on a surface of the epitaxial layer to a thickness of 0.1 μm by the reduced pressure CVD process to form an antioxidant film, only the p-type (100) Si substrate was oxidized. Oxidation was performed at high pressure for reducing the oxidation time (wet oxidation at 1200° C. under a pressure of 6.57 kg/cm$^2$). The porous p-type (100) Si substrate having a thickness of 200 microns was completely oxidized within 24 minutes. The Si$_3$N$_4$ layer was then removed to form a Si single crystal layer having a thickness of 1 μm on the upper side of the transparent SiO$_2$ substrate.

As a result of observing the sectional surface by a transmission electronic microscope, it was confirmed that no crystal defect was newly introduced into the Si layer, and good crystallinity was maintained.

(Embodiment 6)

A p-type (100) Si single crystal substrate having a thickness of 200 microns was subjected to anodic etching in a 50% HF solution. During this oxidation, the current density was 100 mA/cm$^2$. During this process, the rate with which the substrate was made porous was 8.4 μm/min., and the whole p-type (100) Si substrate having a thickness of 200 microns was made porous within 24 minutes.

A Si epitaxial layer was grown to a thickness of 0.5 micron on the p-type (100) porous Si substrate at a low temperature by the plasma CVD process. The conditions for deposition were the following:

Gas: SiH$_4$
High-frequency power: 100 W
Temperature: 800° C.
Pressure: 1×10$^{-2}$ Torr
Growth rate: 2.5 nm/sec After a surface of the epitaxial layer had been oxidized to a thickness of 50 nm, Si$_3$N$_4$ was deposited on the surface of the epitaxial layer to a thickness of 0.1 μm by the reduced pressure CVD process to form an antioxidant film, and only the p-type (100) Si substrate was then oxidized. The oxidation was performed under high pressure for reducing the oxidation time (wet oxidation at 1200° C. under a pressure of 6.57 kg/cm$^2$). The porous p-type (100) Si substrate having a thickness of 200 microns was completely oxidized within 24 minutes. The Si$_3$N$_4$ layer was then removed to form a Si single crystal layer having a thickness of 1 μm on the upper side of the transparent SiO$_2$ substrate.

As a result of observing the sectional surface by a transmission electronic microscope, it was confirmed that no crystal defect was newly introduced into the Si layer, and good crystallinity was maintained.

(Embodiment 7)

An n-type Si layer of 1 micron was formed by implanting proton ions into a surface of a p-type (100) Si substrate having a thickness of 200 microns. The amount of H$^+$implanted was 5×10$^{15}$ (ions/cm$^2$). The substrate was then subjected to anodic etching in a 50% HF solution. During the oxidation, the current density was 100 mA/cm$^2$. The rate with which the substrate was made porous was 8.4 μm/min., and the whole p-type (100) Si substrate having a thickness of 200 microns was oxidized within 24 minutes. As described above, in the anodic etching, only the p-type (100) Si substrate was made porous, while the n-type Si layer was not changed. After a surface of the n-type Si layer had been oxidized to a thickness of 50 nm, Si$_3$N$_4$ was deposited on the surface to a thickness of 0.1 μm by the reduced pressure CVD process to form an antioxidant film, and only the p-type (100) Si substrate was then oxidized. The porous p-type (100) Si substrate having a thickness of 200 microns was oxidized within 2 hours. The Si$_3$N$_4$ layer was then removed to form a Si single crystal layer having a thickness of 1 μm on the upper side of the transparent SiO$_2$ substrate.

As a result of observing the sectional surface by a transmission electronic microscope, it was confirmed that no crystal defect was newly introduced into the Si layer, and good crystallinity was maintained.

(Embodiment 8)

A p-type (100) Si single crystal substrate having a thickness of 200 microns was subjected to anodic etching in a 50% HF solution. During this oxidation, the current density was 100 mA/cm$^2$. During this process, the rate with which the substrate was made porous was 8.4 μm/min., and the whole p-type (100) Si substrate having a thickness of 200 microns was made porous within 24 minutes.

Si$_3$N$_4$ was deposited on the surface of the porous substrate to a thickness of 0.1 μm by the vacuum CVD process to form an antioxidant film, and the porous Si substrate was oxidized in a thickness of 170 microns by high-pressure oxidation, but a region of the porous substrate, which had a thickness of 30 microns, immediately below the Si$_3$N$_4$ layer was left unoxidized.

After the porous Si substrate had been oxidized to the desired thickness, the SiN$_4$ layer was removed, and a Si epitaxial layer of 0.5 micron was then grown on the exposed unoxidized surface of the porous Si at low temperature by MBE (Molecular Beam Epitaxy). The conditions for deposition were the following:

Temperature: 700° C.
Pressure: 1×10$^{-9}$ Torr
Growth rate: 0.1 nm/sec

After the surface of the thus-formed Si epitaxial layer has been oxidized to a thickness of 500 nm, a $Si_3N_4$ layer of 0.1 micron was deposited by the reduced pressure CVD process to form an antioxidant film, and only the remaining unoxidized porous polycrystal Si region left below the Si epitaxial layer was then oxidized by the same method as that described above. As a result, the substrate on which the epitaxial layer was provided was changed to $SiO_2$.

The $Si_3N_4$ layer was then removed to form a Si single crystal layer having a thickness of about 0.5 micron on the upper side of the transparent $SiO_2$ substrate.

As a result of observing the sectional surface of the thus-produced semiconductor substrate by a transmission electronic microscope, it was confirmed that the Si layer had no crystal defect and good crystallinity.

As in this embodiment, the stress applied to the epitaxial layer can be reduced by slightly oxidizing the surface of the epitaxial layer.

(Embodiment 9)

A semiconductor substrate having a Si single crystal layer which has a thickness of about 0.5 micron was produced. The Si single crystal layer was formed on a transparent $SiO_2$ substrate by the same method as that employed in Embodiment 8 with the exception that a Si epitaxial layer was grown to a thickness of 0.5 micron by a plasma CVD process, and that a $Si_3N_4$ was formed after the surface of the epitaxial layer had been oxidized to a thickness of 50 nm. The conditions for deposition of the Si epitaxial layer were the following:
Gas: $SiH_4$
High-frequency power: 100 W
Temperature: 800° C.
Pressure: $1 \times 10^{-2}$ Torr
Growth rate: 2.5 nm/sec As a result of observing the sectional surface of the thus-produced semiconductor substrate by a transmission electronic microscope, it was confirmed that the Si layer had no crystal defect and good crystallinity.

(Embodiment 10)

A Si single crystal layer having a thickness of about 0.5 micron was formed on a transparent $SiO_2$ substrate to produce a semiconductor substrate by the same method as that employed in Embodiment 9 with the exception that the conditions for deposition for forming a Si epitaxial layer were changed to the following:
Gas: $SiH_2Cl_2$ (0.6 l/min)
Carrier gas: $H_2$ (120 l/min)
Temperature: 850° C.
Pressure: 50 Torr
Growth rate: 0.1 nm/sec As a result of observing the sectional surface of the thus-produced semiconductor substrate by a transmission electronic microscope, it was confirmed that the Si layer had no crystal defect and good crystallinity.

(Embodiment 11)

A semiconductor substrate of the present invention was produced by the same method as that employed in Embodiment 1 with the exception that the n-type epitaxial layer had a thickness of 5000 Å. A P-channel field effect transistor was produced by a usual process of producing a semiconductor using the substrate produced.

The process of producing the transistor is briefly described below with reference to the schematic sectional view shown in FIG. 3.

Figure 3A:
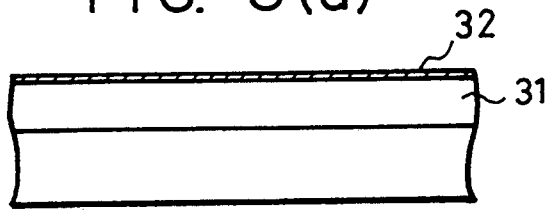
FIG. 3 is a schematic sectional view for explaining the step of producing a field effect transistor.
Figure 3B:
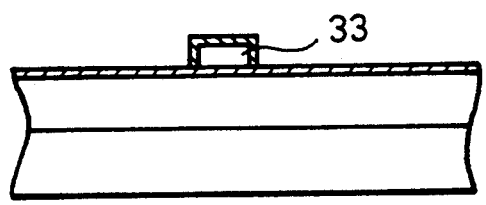
Figure 3C:
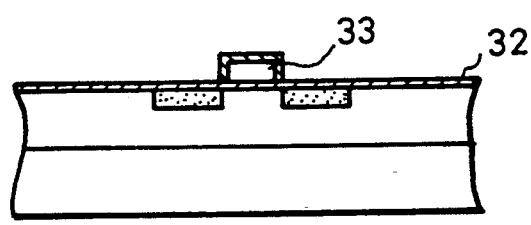
Figure 3D:
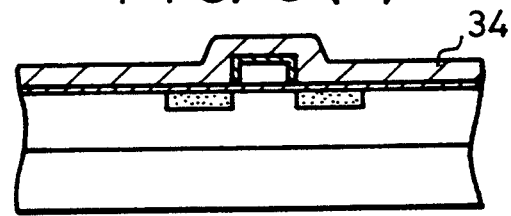
Figure 3E:
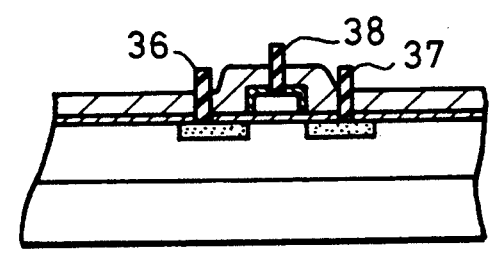

As shown in FIG. 3(a), a $SiO_2$ gate insulating film 32 was first formed on a Si single crystal 31. As shown in FIG. 3(b), a polycrystal Si was then formed as a gate 33 on the gate insulating film 32, and the surface of the polycrystal Si was then oxidized. As shown in FIG. 3(c), a source/drain region was then formed by implanting ions of B element. As shown in FIG. 3(d), an interlayer insulating film 34 was then formed so as to cover the gate insulating layer 32 and the gate electrode 33. As shown in FIG. 3(e), in the last step, contact holes were formed in the interlayer insulating film 34, and electrodes 36, 37, 38 were formed to produce a field effect transistor.

The gate oxide film of the thus-produced field effect transistor had a thickness of 800 Å, and ions of B element were implanted in the source/drain region at $1 \times 10^{15}$ ions/$cm^2$ and 35 KeV. Channel doping was not effected.

The carrier mobility, S coefficient (subthreshold swing) and threshold voltage of the thus-formed field effect transistor are shown in Table 1.

(Comparative Example 1)

Field effect transistors were produced by the same method as that employed in Embodiment 11 with the exception that substrates having the polycrystal Si layers respectively formed on a Si wafer (Si single crystal substrate) and a glass substrate by the CVD process were used.

The carrier mobility and S coefficient of each of the thus-produced field effect transistors of Comparative Example are shown in Table 1.

TABLE 1

| | Carrier Mobility ($cm^2$/V. sec) | S Coefficient (mV/decade) | Threshold Voltage (V) |
|---|---|---|---|
| Embodiment 11 | 260 | 123 | −1.2 |
| Si single crystal substrate | 270 | 120 | −1.0 |
| Polycrystal Si on glass substrate | 10 | 500 | −4.0 |

As seen from Table 1, the transistor of Embodiment 11 produced in accordance with the present invention has properties which are not inferior to those of the transistor formed by using a silicon single crystal wafer, and it has extremely excellent characteristics, as compared with the transistor formed by using the substrate having the polycrystal Si formed on a glass substrate.

In addition, the method of the present invention has the advantages of the SOI technique and is capable of producing a transistor having extremely excellent characteristics by using a light-transmitting substrate different from a Si single crystal substrate, as compared with the transistor formed by using a glass substrate.

As described above, the present invention can provide a method of producing a semiconductor substrate which has none of the above-described problems and satisfies the above requirements.

The present invention can also provide a method which is superior in productivity, uniformity, controllability and economy for forming, on a transparent substrate (light-transmitting substrate), a Si crystal layer having excellent crystallinity equivalent to that of a single crystal wafer.

The present invention can further provide a method of producing a semiconductor substrate which is capable of realizing and making use of the advantages of conventional SOI devices.

The present invention can provide a method of producing a semiconductor substrate which can be used for producing a large scale integrated circuit having the SOI structure in place of expensive SOS and SIMOX.

Since a thin film Si layer deposited on a glass substrate which is representative of light-transmitting substrates is generally an amorphous layer, or at best a polycrystal layer, because it reflects the disorder of the crystal structure of the substrate, a required high-quality device cannot be easily produced. This is because the substrate has an amorphous crystal structure. A single crystal layer having good properties cannot be obtained by simply depositing a Si layer. A light-transmitting substrate is required for a contact sensor and a projection-type liquid crystal image display, and a high-quality driving element is required for increasing the density, resolution and fineness. A single crystal layer having excellent crystallinity is consequently required. A driving element which satisfies the requirements for performance cannot be produced by using amorphous Si or polycrystal Si because of the crystal structure having many defects.

Namely, it is a matter of course that a single crystal layer formed on a light-transmitting substrate is important for the above applications and it can be used for realizing the advantages of conventional SOI devices.

In the present invention, the lower portion of a Si single crystal substrate which intrinsically has good properties and which is used as a starting material is changed to transparent $SiO_2$, and a single crystal layer is left on the surface of the substrate. As described in detail in Embodiments, the present invention enables many processes to be performed for a short time and significant improvements in productivity and economy.

What is claimed is:

1. A method for producing a light transmitting semiconductor substrate comprising the sequential steps of:
   (1) making a silicon substrate porous over entire thickness region thereof,
   (2) forming a silicon single crystal on said porous substrate,
   (3) forming an antioxidant layer on said silicon single crystal
   (4) oxidizing said entire porous silicon substrate, wherein said substrate is light transmitting and wherein said silicon single crystal is formed in a flat and uniform layer on said light transmitting substrate.

2. A method of producing a semiconductor substrate according to claim 1, wherein said silicon single crystal formed on said substrate has a thickness of no more than 50 microns.

3. A method of producing a semiconductor substrate according to claim 1, wherein said oxidizing step includes the step of heating in an atmosphere containing oxygen.

4. A method of producing a semiconductor substrate according to claim 3, wherein said oxidizing step is carried out at a pressure higher than the atmospheric pressure.

5. A method of producing a semiconductor substrate according to claim 1, wherein said silicon single crystal is formed by epitaxial growth.

6. A method of producing a semiconductor substrate according to claim 1, wherein said silicon single crystal is formed by a process selected from the group consisting of a molecular beam epitaxial process, a plasma CVD process, an optical CVD process and a bias sputtering process.

7. A method of producing a semiconductor substrate according to claim 1, wherein said step of making said silicon substrate porous is an anodic etching step.

8. A method of producing a semiconductor substrate according to claim 7, wherein said anodic etching step is performed in a HF solution.

9. A method of producing a semiconductor substrate according to claim 1, wherein said silicon single crystal is of the n-type.

10. A method of producing a semiconductor substrate according to claim 1, wherein the density of said porous substrate is 1.06 $g/cm^3$.

11. A method of producing a semiconductor substrate according to claim 1, wherein said silicon substrate is of p-type.

12. A method of producing a semiconductor substrate according to claim 11, wherein the concentration of impurities contained in said p-type silicon substrate is at least $10^{13}$ cm$^{-3}$.

13. A method of producing a semiconductor substrate comprising the steps of:
   providing a silicon substrate having a first side which is of the n-type, said n-type side having a thickness of no more than 50 microns and a second side, making said second side of said silicon substrate porous, and oxidizing entire porous silicon substrate.

14. A method of producing a semiconductor substrate according to claim 13, wherein said second side of said silicon substrate which is made porous is of the p-type.

15. A method of producing a semiconductor substrate according to claim 13, wherein said n-type side has a thickness of no more than 50 microns.

16. A method of producing a semiconductor substrate according to claim 13, wherein said oxidizing step includes a step of heating in an atmosphere containing oxygen.

17. A method of producing a semiconductor substrate according to claim 16, wherein said oxidizing step is carried out at a pressure higher than the atmospheric pressure.

18. A method of producing a semiconductor substrate according to claim 13, wherein said step of making said second side of said silicon substrate porous is an anodic etching step.

19. A method of producing a semiconductor substrate according to claim 18, wherein said anodic etching step is carried out in a HF solution.

20. A method of producing a semiconductor substrate according to claim 13, wherein said n-type silicon is formed by irradiation of protons or epitaxial growth.

21. A method of producing a semiconductor substrate according to claim 13, further comprising the step of forming, after making said second side of said silicon substrate porous, an antioxidant layer on said n-type first side of said silicon substrate.

22. A method of producing a semiconductor substrate according to claim 21, wherein a buffer layer is provided between said antioxidant layer and said first side of said silicon substrate.

23. A method of producing a semiconductor substrate according to claim 13, wherein the density of said porous substrate is 1.06 g/cm$^3$.

24. A method of producing a semiconductor substrate comprising the steps of:
  (1) making a silicon single crystal substrate entirely porous,
  (2) forming a first antioxidant layer on at least one side of said porous silicon,
  (3) oxidizing said porous silicon to leave a portion of said porous silicon on the side facing said first antioxidant layer unoxidized,
  (4) removing said first antioxidant layer,
  (5) forming a silicon single crystal layer on said unoxidized portion of said porous silicon,
  (6) forming a second antioxidant layer on said silicon single crystal layer,
  (7) oxidizing said unoxidized portion of said porous silicon, and
  (8) removing said second antioxidant layer.

25. A method of producing a semiconductor substrate according to claim 24, wherein said silicon single crystal layer has a thickness of no more than 50 microns.

26. A method of producing a semiconductor substrate according to claim 24, wherein said oxidizing step includes the step of heating in an atmosphere containing oxygen.

27. A method of producing a semiconductor substrate according to claim 26, wherein said oxidizing step is carried out at a pressure higher than the atmospheric pressure.

28. A method of producing a semiconductor substrate according to claim 24, wherein said silicon single crystal layer is formed by epitaxial growth.

29. A method of producing a semiconductor substrate according to claim 24, wherein said silicon single crystal layer is formed by a process selected from the group consisting of a molecular beam epitaxial process, a plasma CVD process, an optical CVD process and a bias sputtering process.

30. A method of producing a semiconductor substrate according to claim 24, wherein said step of making said silicon substrate porous is an anodic etching step.

31. A method of producing a semiconductor substrate according to claim 30, wherein said anodic etching step is carried out in a HF solution.

32. A method of producing a semiconductor substrate according to claim 24, wherein at least one of said first and second antioxidant layers is made of silicon nitride.

33. A method of producing a semiconductor substrate according to claim 1, wherein said silicon single crystal substrate is of the n-type.

34. A method of producing a semiconductor substrate according to claim 33, wherein the concentration of impurities contained in said n-type silicon substrate is 10$^{13}$ cm$^{-3}$ or more.

35. A method of producing a semiconductor substrate according to claim 24, wherein said silicon substrate is of the p-type.

36. A method of producing a semiconductor substrate according to claim 35, wherein the concentration of impurities contained in said p-type substrate is at least 10cm$^{-3}$.

37. A method of producing a semiconductor substrate according to claim 24, wherein said silicon substrate is of the n-type.

38. A method of producing a semiconductor substrate according to claim 37, wherein the concentration of impurities contained in said n-type silicon substrate is at least 10$^{13}$ cm$^{-3}$.

39. A method of producing a semiconductor substrate according to claim 24, wherein a buffer layer is provided between said antioxidant layer and silicon single layer.

40. A method of producing a semiconductor substrate according to claim 24, wherein the density of said porous substrate is 1.06 g/cm$^3$.

41. A method of producing a semiconductor substrate comprising the steps of:
  (1) making a silicon single crystal substrate entirely porous,
  (2) forming an antioxidant layer on at least one side of said porous silicon,
  (3) oxidizing said porous silicon to leave a portion of said porous silicon on a side facing said first oxidant layer unoxidized,
  (4) removing the antioxidant layer,
  (5) forming a silicon single crystal layer on said unoxidized portion of said porous silicon, and
  (6) oxidizing the unoxidized portion of the porous silicon.

42. A method of producing a semiconductor substrate according to claim 41, wherein said silicon substrate is of p-type.

43. A method of producing a semiconductor substrate according to claim 42, wherein the concentration of impurities contained in said p-type silicon single crystal layer is 10$^{19}$ cm$^{-3}$.

44. A method of producing a semiconductor substrate according to claim 41, wherein said silicon single crystal layer has a thickness of no more than 50$\mu$.

45. A method of producing a semiconductor substrate according to claim 41, wherein the oxidizing step includes the step of heating in an atmosphere containing oxygen.

46. A method of producing a semiconductor substrate according to claim 41, wherein the oxidizing step is carried out at a pressure higher than the atmosphere.

47. A method of producing a semiconductor substrate according to claim 41, wherein said silicon single crystal is formed by epitaxial growth.

48. A method of producing a semiconductor substrate according to claim 41, wherein said silicon single crystal is formed by a process selected from the group consisting of a molecular beam epitaxial process, a plasma CVD process, an optical CVD process and a bias sputtering process.

49. A method of producing a semiconductor substrate according to claim 41, wherein said step of making said silicon substrate porous is an anodization step.

50. A method of producing a semiconductor substrate according to claim 49, wherein said anodization step is carried out in a HF solution.

51. A method of producing a semiconductor substrate according to claim 41, wherein said antioxidant layer is made of silicon nitride.

52. A method of producing a semiconductor substrate according to claim 41, wherein said silicon single crystal layer is of n-type.

53. A method of producing a semiconductor substrate according to claim 52, wherein the concentration of impurities contained in said n-type silicon single crystal layer is 10$^{13}$ cm$^{-3}$.

54. A method of producing a semiconductor substrate according to claim 38, wherein a buffer layer is provided between said antioxidant layer and said silicon single layer.

55. A method of producing a semiconductor substrate according to claim 41, wherein the density of said porous substrate is 1.06 g/cm$^3$.

56. A method of producing a semiconductor substrate, comprising the steps of:
    forming an antioxidant layer on at least one side of the porous silicon substrate which is made porous over its entire thickness;
    oxidizing said porous silicon to leave a portion of said porous silicon on the side carrying said antioxidant layer unoxidized;
    removing said antioxidant layer;
    forming a single crystal silicon on the unoxidized portion of said porous silicon; and
    oxidizing said unoxidized portion of said porous silicon.

57. A method of producing a semiconductor substrate according to claim 56, wherein said silicon substrate is of p-type.

58. A method of producing a semiconductor substrate according to claim 57, wherein the concentration of impurities contained in said p-type silicon single crystal layer is $10^{19}$ cm$^{-3}$.

59. A method of producing a semiconductor substrate according to claim 57, wherein the concentration of impurities contained in said n-type silicon single crystal layer is $10^{19}$ cm$^{-3}$.

60. A method of producing a semiconductor substrate according to claim 56, wherein said silicon single crystal layer has a thickness of 50 microns or less.

61. A method of producing a semiconductor substrate according to claim 56, wherein said oxidizing step includes the step of heating in an atmosphere oxygen.

62. A method of producing a semiconductor substrate according to claim 61, wherein said oxidizing step is carried out at a pressure higher than the atmosphere.

63. A method of producing a semiconductor substrate according to claim 56, wherein said silicon single crystal is formed by epitaxial growth.

64. A method of producing a semiconductor substrate according to claim 56, wherein said silicon single crystal is formed by a process selected from the group consisting of a molecular beam epitaxial process, a plasma CVD process, an optical CVD process and a bias sputtering process.

65. A method of producing a semiconductor substrate according to claim 56, wherein said step of making said silicon substrate porous is an anodization step.

66. A method of producing a semiconductor substrate according to claim 65, wherein said anodization step is carried out in an HF solution.

67. A method of producing a semiconductor substrate according to claim 56, wherein said antioxidant layer is made of silicon nitride.

68. A method of producing a semiconductor substrate according to claim 56, wherein said silicon single crystal layer is of n-type.

69. A method of producing a semiconductor substrate comprising the steps of:
    forming a silicon single crystal on a silicon substrate which is made porous over its entire thickness; and
    oxidizing said silicon substrate, wherein said silicon substrate is light transmitting.

70. A method of producing a semiconductor substrate according to claim 69, wherein said silicon substrate is of p-type.

71. A method of producing a semiconductor substrate according to claim 69, wherein said silicon single crystal layer has a thickness of 50 microns or less.

72. A method of producing a semiconductor substrate according to claim 69, wherein said oxidizing step includes the step of heating in an atmosphere containing oxygen.

73. A method of producing a semiconductor substrate according to claim 69, wherein said oxidizing step is carried out at a pressure higher than the atmosphere.

74. A method of producing a semiconductor substrate according to claim 69, wherein said silicon single crystal is formed by epitaxial growth.

75. A method of producing a semiconductor substrate according to claim 69, wherein said silicon single crystal is formed by a process selected from the group consisting of a molecular beam epitaxial process, a plasma CVD process, an optical CVD process and a bias sputtering process.

* * * * *

UNITED STATES PATENT AND TRADEMARK OFFICE
CERTIFICATE OF CORRECTION

PATENT NO. : 5,433,168

DATED : July 18, 1995

INVENTOR : TAKEO YONEHARA

It is certified that errors appear in the above-identified patent and that said Letters Patent is hereby corrected as shown below:

On the title page, item

[56] References Cited

Other Publications, insert --Patridge, S.L., "Silicon-on-insulator technology," IEE Proceedings, vol. 133, pt. 1, No. 3, June 1986, pp. 66-76--;

In "Unigami" "Formation of Mechanism" should read --Formation Mechanism--; and

In "Crystallization of Silicon Films", "Class" should read --Glass--.

COLUMN 2

Line 13, "yet" (second occurrence) should be deleted.

COLUMN 5

Line 19, "FIG. 1 (b)," should read --FIG. 1(b)--.

COLUMN 6

Line 13, "$e^{3-}$" should read --$e^-$--.

COLUMN 7

Line 4, "etching oxidation" should read --anodic etching--.

COLUMN 8

Line 3, "a" should read --an--; and

Line 47, "region, the" should read --region. The--.

UNITED STATES PATENT AND TRADEMARK OFFICE
CERTIFICATE OF CORRECTION

PATENT NO. : 5,433,168
DATED : July 18, 1995
INVENTOR : TAKEO YONEHARA

It is certified that errors appear in the above-identified patent and that said Letters Patent is hereby corrected as shown below:

COLUMN 15

Line 47, "crystal" should read --crystal, and--.

COLUMN 17

Line 51, "claim 1," should read --claim 24,--.

COLUMN 18

Line 68, "claim 38," should read --claim 41,--.

Signed and Sealed this

Fourteenth Day of November, 1995

Attest:

Attesting Officer

BRUCE LEHMAN

Commissioner of Patents and Trademarks